(12) United States Patent
Worley

(10) Patent No.: US 6,864,555 B2
(45) Date of Patent: Mar. 8, 2005

(54) PHOTO DETECTOR METHODS TO REDUCE THE DISABLING EFFECTS OF DISPLACEMENT CURRENT IN OPTO-COUPLERS

(76) Inventor: Eugene Robert Worley, 11 Bowditch, Irvine, CA (US) 92620

( * ) Notice: Subject to any disclaimer, the term of this patent is extended or adjusted under 35 U.S.C. 154(b) by 125 days.

(21) Appl. No.: 10/231,844

(22) Filed: Aug. 28, 2002

(65) Prior Publication Data

US 2003/0042405 A1 Mar. 6, 2003

Related U.S. Application Data

(60) Provisional application No. 60/316,862, filed on Sep. 4, 2001.

(51) Int. Cl.[7] ............................................. H01L 27/148
(52) U.S. Cl. ....................... 257/435; 257/232; 257/233; 257/234; 257/435; 257/444; 438/48; 438/69; 438/70
(58) Field of Search ................................. 257/232–234, 257/435, 444, 10, 11, 227, 439, 59, 72, 293

(56) References Cited

U.S. PATENT DOCUMENTS 4,754,312 A * 6/1988 Lanmger et al.
4,980,546 A * 12/1990 Berger

* cited by examiner

*Primary Examiner*—Fetsum Abraham

(57) ABSTRACT

This invention discloses the several means by which transient noise due to capacitance related displacement current can be excluded from the optical signal coming from a silicon detector used in opto-couplers. The exclusion of such noise permits a high degree of detector sensitivity which permits the use of low efficiency silicon based LEDs for opto-coupler applications.

14 Claims, 3 Drawing Sheets

PHOTO DETECTOR METHODS TO REDUCE THE DISABLING EFFECTS OF DISPLACEMENT CURRENT IN OPTO-COUPLERS

This application claims the benefit of Provisional application Ser. No. 60/316,862, filed Sep. 4, 2001.

BACKGROUND OF THE INVENTION

1. Field of the Invention

This invention relates to the field of semiconductor photo detectors used in opto-couplers, and particularly to reducing the disabling effect of displacement current in photo diodes used in opto couplers.

2. Description of the Related Art

Opto couplers are used to allow two electrical systems to communicate with each other while remaining electrically isolated. This communication is achieved by sending light signals using an electrically activated light emitter, typically a Light Emitting Diode (LED), to a photo detector which converts the light signals back into electrical signals. The light passes through a transparent insulator thereby electrically isolating the light emitter and its associated circuitry from the light detector and its associated circuitry. The associated circuitry of the LED side of the optocoupler can include an LED driver, amplifier, etc. The associated detector circuitry can include an amplifier, output drivers, A to D and D to A converters, etc.

Unfortunately, a displacement current can flow from the LED side of the opto coupler into the photo detector and cause an electrical output from the photo detector in addition to the electrical output produced by the light. The displacement current is a consequence of the unavoidable capacitance coupling between the LED side of the opto-coupler and the photo detector. This displacement current flows when the voltage applied to the coupler's LED and its surrounding electrically conductive structures changes with respect to the voltage applied to the coupler's photo detector. The magnitude of the unwanted displacement current flowing from the photo detector is dependent on the dV/dt or the rate change in the voltage between the LED side and the photo detector. The spurious detector signals produced by displacement currents can therefore be disruptive to the normal communication process of the opto-coupler. Thus, there is a strong need to keep displacement current out of the photo detector, especially if the light signal is weak as is the case with silicon based LEDs.

Photo detectors associated with silicon integrated circuits are typically realized using semiconductor junctions. The junction based photo detectors include PN diodes, bipolar transistors, SCRs, and Triacs.

In general terms, the displacement current is given by $$I_{displacement} = C_{coupling} \frac{dV}{dt}$$

where $I_{displacement}$ is the displacement current or current flowing into the capacitance, $C_{coupling}$ is the capacitance between two electrically isolated conductors, and dV/dt is the rate change in voltage between the two isolated conductors.

The relative magnitude of this undesirable current can be estimated. Assume that the transparent insulator of an opto-coupler has a thickness of 300 μm and a relative dielectric constant of 2.8. The parallel plate capacitance per unit area is $$C_{ins} = \frac{\varepsilon_{ins}}{t_{ins}}$$

where $C_{ins}$=capacitance per unit area, $\varepsilon_{ins}$=permativity of insulator, and $t_{ins}$=thickness of insulator. For $t_{ins}$=0.03 cm (300 μm) and $\varepsilon_{ins}$=2.8×8.854c−14 then $C_{ins}$=8.26 pF/cm². Since a reasonable radius for a photo detector is 150 μm assume that the detector area is equal to $\pi \times 0.015^2$ or 0.000707 cm². Then $C_{coupling}$=5.84 fF. To make the calculation worst case, assume that the fringe field coupling is 50% of the parallel plate capacitance for a total capacitance of 1.5×5.84 or 8.75 fF.

Assuming a transient voltage between the chip with the LED and the light detector of $10^6$ V/sec, then $i_{coupling}$=8.75 nA. Some opto-coupler specifications show a "common mode" slew rate as high as $10^9$ V/sec, which produces a displacement current of 8.75 μA for a coupling capacitance of only 8.75F.

For an opto-coupler using a silicon junction avalanche LED, a reasonable quantum efficiency is $10^{-5}$. Assuming a detector quantum efficiency of 0.8, then for an LED current of 10 mA the photo current would be 80 nA. Although an 80 nA data signal current by itself can be readily detected by an amplifier circuit, a superimposed spurious displacement current 100 times greater in magnitude can make data extraction difficult and error prone.

FIG. 1 shows an example of the cross section of a silicon based opto-coupler. Two integrated circuits, 106 and 107, are shown separated by a transparent insulator 108. An LED 111 is built into integrated circuit 106 and emits light through the transparent insulator 108 to a light detector 112 of the receiving integrated circuit 107. Bond wire 104 connects package lead 102 to integrated circuit 106 and bond wire 105 connects package lead 103 to integrated circuit 107. Also shown is the lead frame die attach plate 110 for integrated circuit 106 and the lead frame die attach plate 109 for integrated circuit 107. Package lead 102 connects to integrated circuit 106 and establishes the base potential of integrated circuit 106 and package lead 103 connects to integrated circuit 107 and establishes the base potential of integrated circuit 107. The base potential of each integrated circuit is established through a power supply connection to the substrate of each integrated circuit. The surface of each integrated circuit may contain areas were the voltage is different from the base or substrate potential by several volts.

Under normal operation, light 112 is emitted from LED 111 to light detector 112. However, as shown in FIG. 1, a large electrical spike can exist between the base potentials of integrated circuits 106 and 107. The rate change in the voltage difference produces a displacement current 113 in the insulator 108 between integrated circuits 106 and 107. Some of the displacement current 113 flows out of the light detector 112 potentially disrupting operation.

As can be appreciated by one normally skilled in the art, LED 111 could also be a discrete GaAsP LED.

SUMMARY OF THE INVENTION

According to the present invention, there is provided a means by which the displacement current flowing between two electrically isolated but optically linked semiconductor devices will not cause disruption in the optical communication process between the two semiconductor devices. These methods include using two detectors for differential sensing, using a conducting transparent ground shield over the light detector, using a diffusion or an implanted top layer as a ground shield, and using a MOSFET configured as a light detector with the gate serving as a ground shield. Also, it is shown that more than one level of metal of an integrated circuit can be used to shield interconnect circuitry from displacement current.

DESCRIPTION OF THE PREFERRED EMBODIMENT

Figure 1:
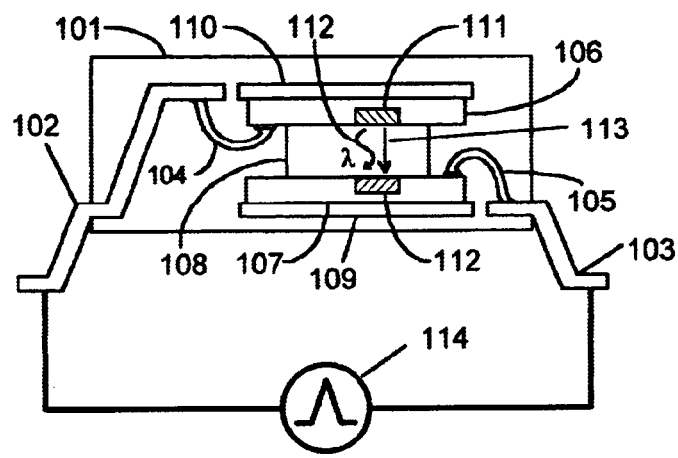
FIG. 1 shows a cross section of an opto coupler illustrating displacement current flow between the two electrically isolated semiconductor devices.
Figure 2:
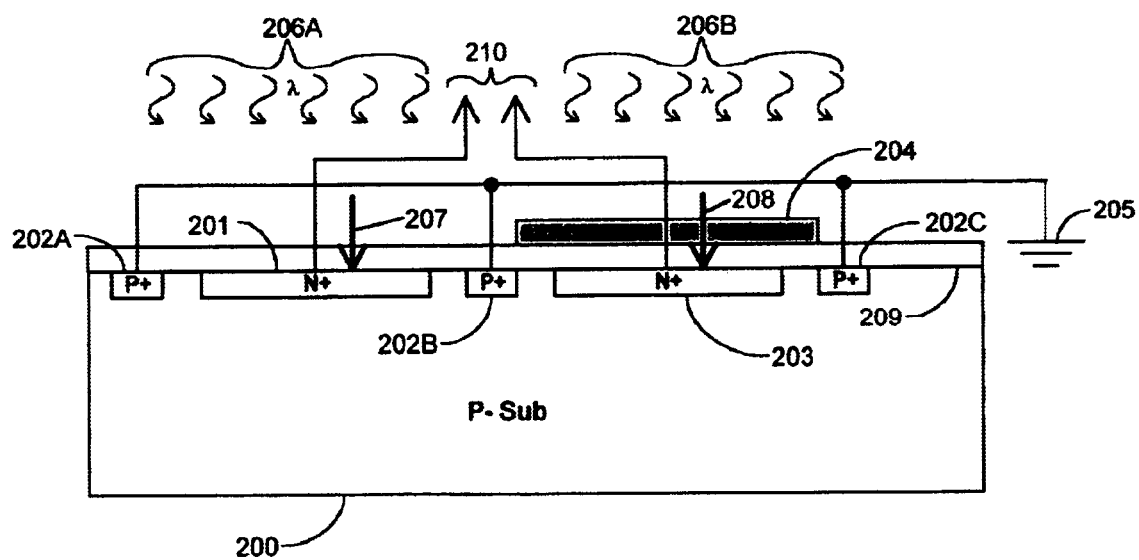
FIG. 2 shows a cross section of a differential junction diode photo detector used to null out displacement current.

FIG. 2 shows an example of a differential light detector which can be used to null out a displacement current induced by the light source elements. Placed in a P type silicon substrate 200 is an N+ implant or diffusion 201, a second N+ implant 203, and three P+ implants, 202A, 202B, and 202C. The first N+ implant 201 forms an N+/P junction diode and the second N+ implant 203 forms a second N+/P junction diode. P+ implants 202A, 202B and 202C form substrate ties or a means of connecting metal conductors to the P substrate 200. Thus, the P substrate 200 areas near the N+ junctions 201 and 203 are robustly tied to ground 205 via the P+ ties 202A, 202B, and 202C.

The diode junction formed with the N+ implant 201 is used as a photo detector in this example. Light 206A coming from the LED source passes through a transparent dielectric 209 such as SiO$_2$ and into the diode formed by the N+ implant 201 thereby creating a photo current. The second diode formed with the N+ implant 203 is identical in size and shape to the first diode formed with the N+ implant 201 but is shielded from any light 206B that might come in over the diode from the LED source. The second diode formed with 203 is used as a voltage reference for the photo diode formed with 201.

The light shield 204 covering N+ implant 203 can be any masked, opaque insulating layer such as a dyed photo resist. The material for the light shield 204 should be thin as possible so as to minimize any difference between the displacement current 207 of the photo diode and the displacement current 208 of the reference diode 203. Also, the light shield 204 can be made of a floating, opaque conductive material such as aluminum, copper, or a barrier metal such as tungsten. A floating, opaque conductor 204 can transmit the displacement current 208 while blocking the light 206B. A conducting light shield 204 works the same as an insulating light shield 204 if, for the insulating light shield, the electric field is uniform over the surface of the reference diode comprising 203 and the electric field is normal or perpendicular to the insulating light shield 204. For this case the electric potential is uniform over the surface of the insulating material and, hence, a relatively thin conducting light shield will have the same field distribution since the potential will be uniform in the shield.

The diodes formed by N+ implants 201 and 203 have a differential signal output 210. Light hitting the structure of FIG. 2 will cause the output of a photo current well above the background junction leakage current on the left output 210 lead that is connected to implant 201 whereas only junction background leakage current will appear on the right output 210 lead that is connected to implant 203. Thus, a differential signal on 210 will result in response to illumination of the structure of FIG. 2.

However, if a rate change in voltage occurs between the structure of FIG. 2 and the LED source a displacement current 207 will flow into 201 and a displacement current 208 will flow into 203. Because of the aforementioned identical geometries of 201 and 203 displacement current 207 and the displacement current 208 will be essentially identical. Thus, a displacement current will produce a change in the common mode current of the output 210 but no change in the differential signal. Thus, light 206A including stray light 206B will produce a differential signal at the output 210 but displacement current 207 and 208 will not.

It is also noted that substrate noise is also presented as a common mode signal on the output 210 and not as a differential signal. Thus, this detector construction is also useful for rejection of substrate 200 noise.

As can be appreciated by one normally skilled in the art, the impurity polarities of FIG. 2 can be reversed. That is, the P substrate can be N type, the substrate tie implants 202A, 202B, and 202C can be N type, the implants 201 and 203 P type. Also, the diode structure of FIG. 2 can be imbedded into a well which is implanted into a substrate of opposite polarity such as a the N well associated with a PFET of CMOS standard process using a P type substrate.

Another method of eliminating the displacement current between an LED source and the light detector is to use a transparent electrostatic shield. An Indium tin oxide electrostatic shield can be deposited over a light detector thus eliminating displacement current from appearing at the output of the detector. Another material that can be used but with less transparency is polysilicon.

Figure 3:
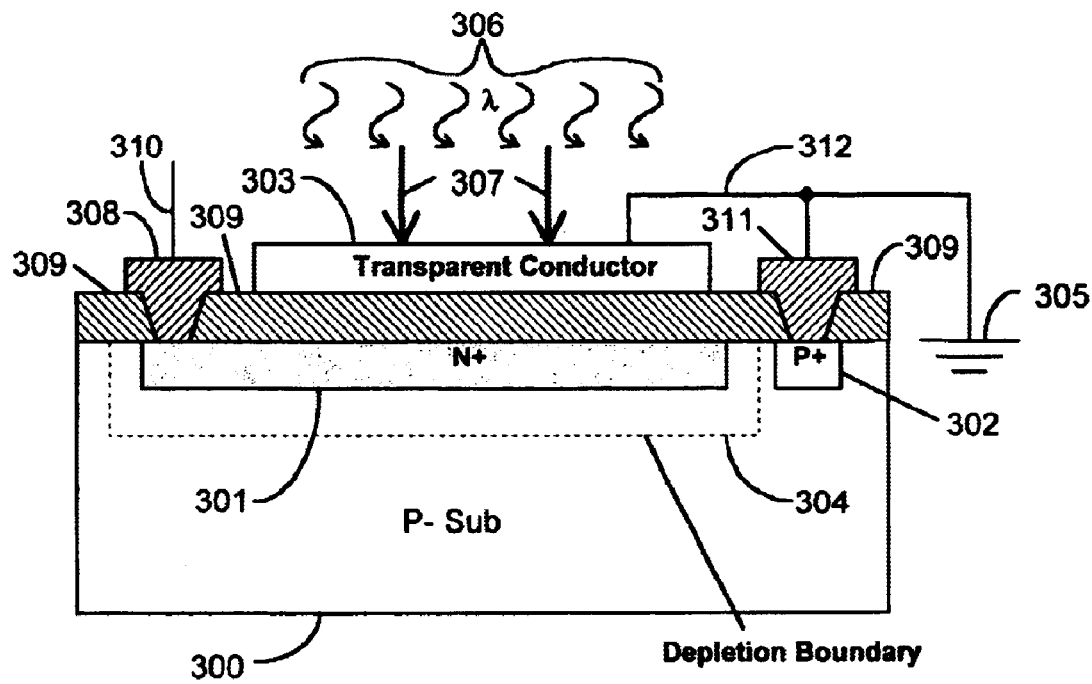
FIG. 3 shows a cross section of a junction diode photo detector with a grounded transparent conductor blocking displacement current.

FIG. 3 shows a cross section of a shielded photo diode detector. The shielded detector consists of a semiconductor substrate 300, an N+ implant 301, transparent interlevel dielectric 309 such as SiO$_2$, a P+ implant 302 to connect the substrate 300 to a metal lead 312, contact metal 308 for the N+ implant, contact metal 311 for the P+ implant 302, a transparent conductor 303, a ground interconnect lead 312, and an electrical ground point 305.

Light 306 from the LED propagates through the transparent conductor 303, through the interlevel dielectric 309 such as SiO$_2$, through the thin N+ implant layer 301, and into the substrate region below the N+ implant 301 where the light is absorbed. The absorption of light in the depletion region, whose boundaries are the N+ implant 301—P substrate 300 interface and the boundary 304, produces an electrical current between the N+ implant 301 and the P substrate 300. Also, photo generated carriers below but near the depletion region boundary 304 can contribute to the electrical current by diffusion. The photo generated electrical current flows out through lead 310 and is referenced to ground 305.

A displacement current 307 flows through the transparent conductor 303 to ground 305 rather than through the N+ implant layer 301 to the photo current output 310.

It is noted that the transparent conductor 303 adds some undesirable capacitance to ground for the output node 301 via electrostatic coupling between the N+ implant layer 301 and the transparent conductor 303. This capacitance can be reduced by increasing the thickness of the interlevel dielectric 309.

To determine the effect of the transparent conductor may have on the detector capacitance assume that the substrate doping is 1e15/cm$^3$ then the capacitance per unit area is 1e4 pf/cm$^2$ or 0.1 fF/$\mu$m$^2$ at zero bias. For an oxide thickness of 1 $\mu$m, the capacitance per unit area is 3453 pF/cm$^2$ or 0.0345 fF/$\mu$m$^2$. Thus, an ITO layer placed above a diode doped 1e15/cm with an intervening SiO$_2$ dielectric thickness of 1 $\mu$m will add 34.5 percent more capacitance to the diode at 0 bias. A transparent conductor made of ITO can be expected to absorb approximately 10% of the light passing through it.

As noted earlier, a thin polysilicon layer can also be used in place of the ITO. The MOSFET gate polysilicon thickness for sub-micron processes can be as thin as 0.25 $\mu$m. To determine how much light is absorbed in a polysilicon shield it will be assumed that the absorption coefficient for polysilicon is the same as that for silicon. The light emission peak wavelength of a silicon avalanche LED is about 590 Å which is yellow. The silicon absorption coefficient for this wavelength is 2 $\mu$m. Thus, yellow light is reduced to 88% from its initial value after passing through 0.25 $\mu$m of silicon. Even thinner thicknesses for polysilicon can be used but may not be useful as the gate material of MOSFETs. Thus, polysilicon can be a useful electrostatic shield for a photo diode due to it high transmission of light if thin enough.

Figure 4:
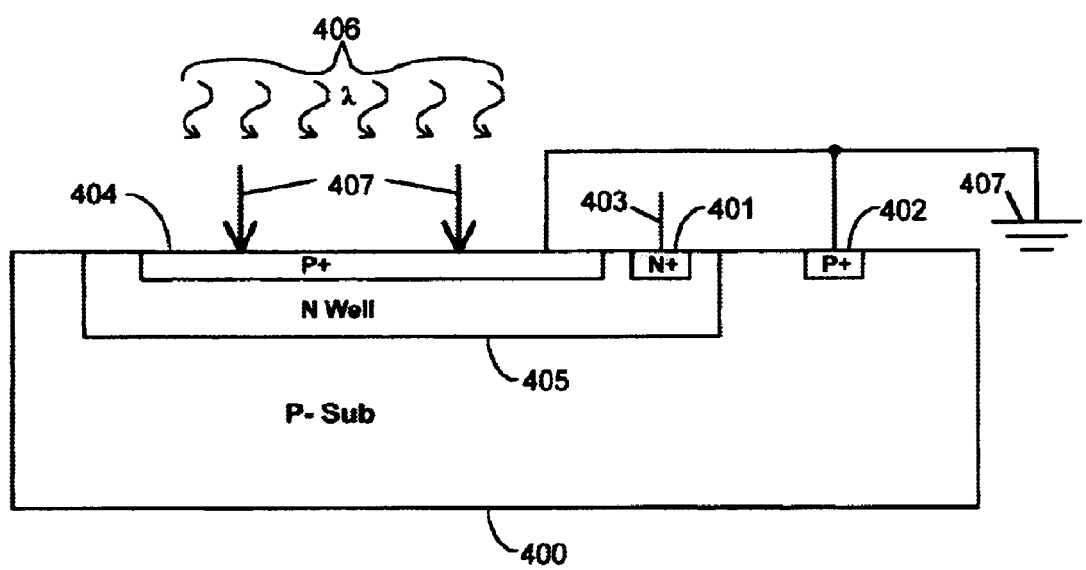
FIG. 4 shows the cross section of a photo junction diode which uses an upper grounded implant to absorb displacement current.

An implanted N Well photo diode with a displacement current ground shield implant can also be made. In this construction, a three terminal N Well based diode is used as shown in FIG. 4. The N Well connects to an output lead 403 using an N+ tie implant 401 and the substrate connects to ground 407 using a P+ implant 402. The top P+ implant layer 404 and the P substrate 400 are connected to ground 407 while the N Well 405 is used as the signal node which is output on 403. The P+ implant layer 404 is made thin to minimize the absorption of light 406. Thus, displacement current 407 will flow through the top P+ implant layer 404 to ground 407 and will not disturb the photo current flowing between the N Well 405 and the P+ implant layer 404 and between the N Well 405 and the P– substrate 400. The P+ implant 404 and N Well 405 can be the same as that used to make the drain/source implant and N Well implant of a PFET, respectively, thereby allowing the structure of FIG. 4 to be made without any additional fabrication steps over that of a standard CMOS process.

Figure 5:
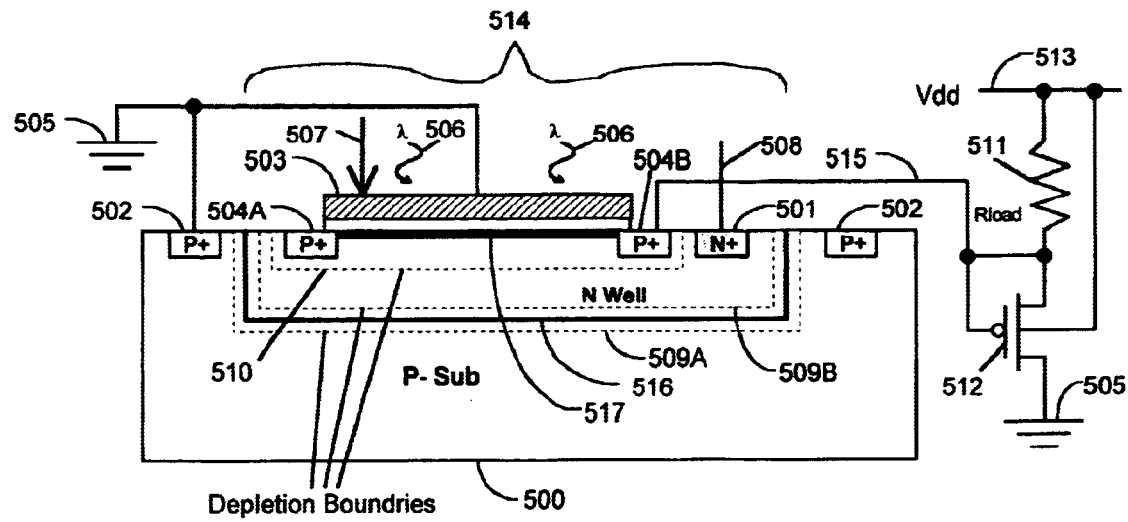
FIG. 5 shows a cross section diagram of a photo MOSFET which uses the gate electrode as a displacement current shield.

FIG. 5 shows the construction of a PFET 514 based photo detector. In this construction, a PFET 514 is used to create a shielded photo diode. The gate polysilicon 503 is used as the transparent electrostatic shield and is connected to ground 505. The drain implant 504A and the source implant 504B of PFET 514 are connected together and are biased via node 515. P+ implants 502 in the P substrate 500 are used to tie the substrate 500 to ground 505. An N+ implant 501 is used to tie the N Well 516 to the detector output 508.

An example of a biasing circuit for the drain 504A and source 504B of 514 is also shown in FIG. 5 and is comprised of a second PFET 512 and a load resistor 511 connected to the drain of PFET 512. The source of PFET 512 is connected to ground 505, the gate of PFET 512 is connected to the drain of PFET 512 which is connected to the load resistor 511. The second end of the load resistor is connected to a positive supply voltage, Vdd 513.

Note that the PFET 514 is biased into the inversion regime so that there is not only a photo carrier collection zone associated with the N Well 516-Substrate 500 junction depletion region that extends from 509A to 509B but also with the depletion region 510 associated with the PFET inversion layer 517. The P+ Drain 504A/Source 504B implants have to be biased such that the PFET 514 is in inversion and such that the N Well 516-substrate 500 junction and the inversion layer 517-N Well 516 junction are reversed biased. One way to generate Drain 504A/Source 504B bias voltage on node 515 is to use the second PFET 512 as reference voltage source as shown. With a large value of $R_{load}$ 511, the output 515 of the reference PFET 512 will be slightly above its threshold voltage with respect to ground 505 and includes the body effect on threshold voltage. Assuming that the threshold voltage of 512 matches that of 514 then the voltage on 515 will cause an inversion layer 517 to form in PFET 514. Node 508 is the photo diode output and can be biased anywhere from the reference voltage on node 515 to Vdd 513. Note that as bias voltage on photo current output 508 is increased above the reference voltage on 515, the depletion boundaries 509A, 509B, and 510 will move causing expansion of the depletion regions wherein photo generated carriers are generated and electrically collected. Thus, collection efficiency and response time suggest the bias voltage on the output node 508 be close to Vdd.

An alternate operating scheme for the PFET based light detector of FIG. 5 is to use the Drain 504A/Source 504B implants as the signal node with the N well 516 and gate 503 tied to a quite or filtered ground. This configuration would prevent substrate 500 noise from interfering with sensing. In this mode photo carriers generated in the depletion region associated with the inversion 517 would be collected by the inversion layer 517. The photo current would therefore flow from the N well 516 to the inversion layer 517. The draw back of this operating configuration is the inversion layer 517 to gate 503 capacitance.

As can be appreciated by one normally skilled in the art, the impurity polarities and voltage polarities shown in FIG. 5 can be reversed.

Figure 6:
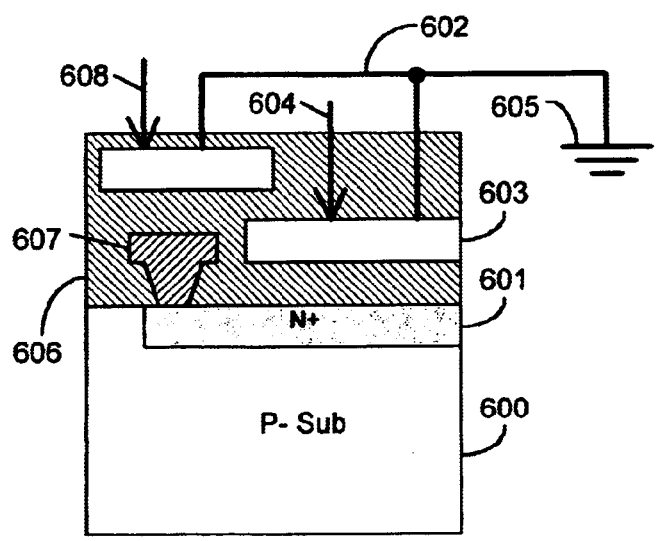
FIG. 6 shows a partial cross section of a photo diode electrically shielded by a transparent conductor.

FIG. 6 shows a partial cross section of a photo diode electrically shielded by a transparent conductor 603 which can be made of indium tin oxide or polysilicon. The N+ implant 601 forms the cathode and collects the photo current to be output from the photo diode while the P substrate 600 forms the anode of the photo diode and is connected via lead 602 to ground 605. The transparent conductor 603 is also tied to ground 605 so that any displacement current 604 from the LED source is shunted to ground 605. Transparent interlevel oxide 606 such as, but not limited to SiO$_2$, is used to insulate interconnect metal, polysilicon used for MOSFET gates, and the transparent conductor 603 which may also be polysilicon. Terminal 607 is a metal contact to the output interconnect metal of the photo diode. For the process used to make the photo diode of FIG. 6 it is assumed that at least a second level of metal is available. The second level of metal is used to make an electrostatic shield 608 for the terminal 607 and any areas of the N+ implant 601 not covered by the transparent conductor 603 thereby shunting displacement current away from the photo output signal terminal 607. This shielding method can also be applied to any interconnect metal connected to the photo detector's output. Thus, the use of a second or higher level of metal tied to ground in combination with a transparent conductor 603 can prevent to a very high degree any displacement current from flowing into the photo signal node including any interconnect metal going to a sense amplifier. It is noted that interconnect shielding method of FIG. 6 can be applied to any of output nodes of the photo detectors described herein.

What is claimed is:

1. A light detector having a differential output, comprising:
   a first junction diode for converting incoming light into photocurrent;
   a second junction diode;
   a light shield substantially covering the second junction diode;
   a first output lead coupled to the first junction diode; and
   a second output lead coupled to the second junction diode;
   wherein the first output lead and the second output lead form the differential output of the light detector.

2. The light detector of claim 1, wherein the first junction diode comprises a first N+ implant in a P type silicon substrate and the second junction diode comprises a second N+ implant in the P type silicon substrate.

3. The light detector of claim 1, wherein the second junction diode is substantially identical to the first junction diode.

4. The light detector of claim 1, wherein the light shield comprises an opaque insulating layer.

5. The light detector of claim 4, wherein the opaque insulating layer is made of dyed photo resist.

6. The light detector of claim 1, wherein the light shield comprises an opaque conductive material.

7. The light detector of claim 6, wherein the opaque conductive material is aluminum.

8. The light detector of claim 6, wherein the opaque conductive material is copper.

9. The light detector of claim 6, wherein the opaque conductive material is tungsten.

10. A shielded light detector, comprising:
    a photo diode;
    a dielectric layer formed over the photo diode;
    a transparent electrostatic shield formed over the dielectric layer and the photo diode; and
    a ground lead coupling the transparent electrostatic shield to an electrical ground.

11. The light detector of claim 10, wherein the transparent electrostatic shield comprises indium tin oxide.

12. The light detector of claim 10, wherein the transparent electrostatic shield comprises polysilicon.

13. The light detector of claim 10, wherein the photo diode comprises an N+ implant in a P type substrate.

14. A method for using a PFET as a light detector, the PFET comprising a polysilicon gate and a source and drain in an N well, wherein the N well is in a P type substrate, the method comprising:
    coupling the gate of the PFET and the P substrate to a ground;
    coupling the N well to an output of the light detector;
    biasing the output between a reference voltage and a power supply voltage; and
    biasing the source and drain of the PFET to form an inversion layer in the PFET.

* * * * *